US007889579B2

(12) United States Patent
Faue

(10) Patent No.: US 7,889,579 B2
(45) Date of Patent: Feb. 15, 2011

(54) USING DIFFERENTIAL DATA STROBES IN NON-DIFFERENTIAL MODE TO ENHANCE DATA CAPTURE WINDOW

(75) Inventor: Jon Allan Faue, Colorado Springs, CO (US)

(73) Assignee: ProMOS Technologies Pte. Ltd., Singapore (SG)

( * ) Notice: Subject to any disclaimer, the term of this patent is extended or adjusted under 35 U.S.C. 154(b) by 348 days.

(21) Appl. No.: 12/021,209

(22) Filed: Jan. 28, 2008

(65) Prior Publication Data

US 2009/0190410 A1    Jul. 30, 2009

(51) Int. Cl.
G11C 7/00    (2006.01)
(52) U.S. Cl. .................. 365/193; 365/189.17; 365/191; 365/233.13
(58) Field of Classification Search ........ 365/189.17 X, 365/189.12, 191 X, 193 O, 198, 233.13 X, 365/189.17, 191, 193, 233.13
See application file for complete search history.

(56) References Cited

U.S. PATENT DOCUMENTS 6,172,938 B1    1/2001 Suzuki et al.
6,317,369 B1 *  11/2001 Kubo et al. .................. 365/193
6,819,602 B2 *  11/2004 Seo et al. ..................... 365/193
7,076,677 B2 *   7/2006 Falconer et al. ............. 713/400
7,120,067 B2 *  10/2006 Han ....................... 365/189.05

OTHER PUBLICATIONS

"DDR2 SDRAM Specification", JEDEC79-2C, JEDEC Standard, JEDEC Solid State Technology Association, May 2006, pp. i-v, 1-109.

* cited by examiner

*Primary Examiner*—VanThu Nguyen
(74) *Attorney, Agent, or Firm*—William J. Kubida; Peter J. Meza; Hogan Lovells LLP

(57) ABSTRACT

A data capture circuit includes strobes that track input data even when conditions arise that cause the differences in skew from interpreting data state ones and zeros. This is accomplished whether these skews arise from reference voltage variation, data pattern loading, power supply droop, process variations within the chip itself, or other causes. The differential input strobes of the data capture circuit are input into individual input buffers, each compared against a reference voltage individually, as well as a data input pin. The outputs from these buffers are maintained separate from each other all the way to the point where the input data is latched. In latching the input data, data ones are latched entirely based on input signals derived from a rising edge (both strobes and data), and zeros are latched entirely based on input signals derived from a falling edge (both strobes and data).

10 Claims, 17 Drawing Sheets

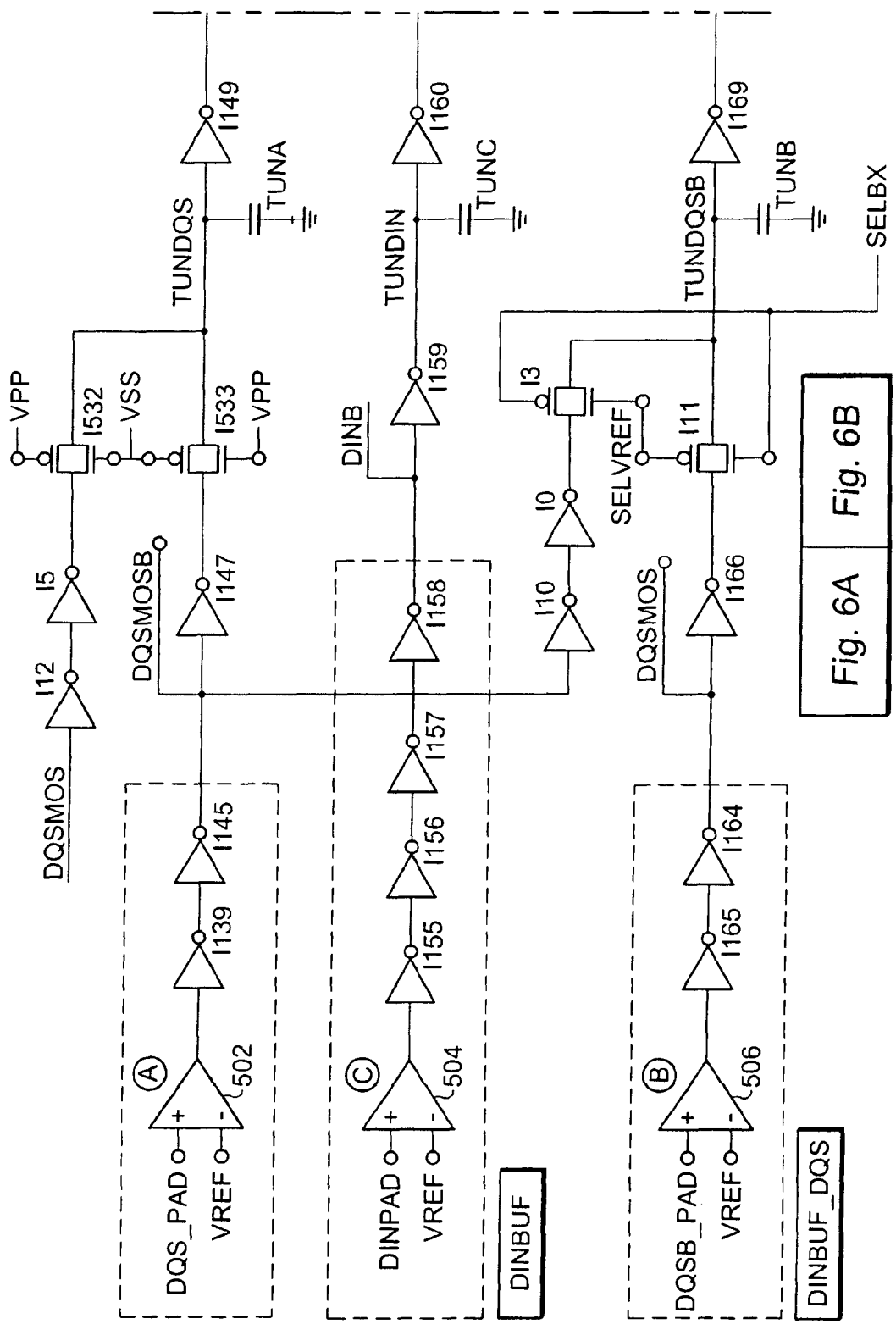

US 7,889,579 B2

USING DIFFERENTIAL DATA STROBES IN NON-DIFFERENTIAL MODE TO ENHANCE DATA CAPTURE WINDOW

BACKGROUND OF THE INVENTION

This invention is related to integrated circuit memories or any other type of integrated circuit having a data input and more particularly to a circuit and method for improving the data capturing accuracy of those integrated circuits.

In a typical integrated circuit memory, input data is captured using one or more differential input strobe circuits. Using the differential input strobes in true differential mode (i.e. both input to the same differential amplifier) results in an internal strobe signal that tracks the external strobes (provided by a system memory controller) well, but does not necessarily track the input data very well, which is of course the primary purpose of the data capture circuitry. This is especially true in regards to variation in data skew resulting from data ones being detected differently than data zeros by the primary differential input amplifiers. The input differential amplifier used by the strobes, since it has differential inputs, is mostly immune to these variations. The single-ended (data is compared against a fixed VREF voltage) data input amplifiers are subject to much more variations, which result in an undesirably reduced data capture window.

Referring now to FIG. 1, the prior art data capture method is shown. Both input data signals DQS and DQSB are inputs to differential amplifier 104. Both input data strobe signals DQS INPUT STROBE and DQSB INPUT STROBE are inputs to differential amplifier 102. Output signals DQS_CHIP and DQSB_CHIP are provided at the outputs of differential amplifiers 102 and 104. Since both data signals DQS and DQSB are inputs to differential amplifier 104, the internal DQS_CHIP signal switches based on the cross-over of the two inputs regardless of the relationship with the VREF (shown in FIG. 2). However, the data input pins (DINPAD) are referenced against a stable VREF (usually VCCQ/2) using differential amplifier 202. Therefore, internal skews from the din-pad switch point vary heavily on the VREF point and the characteristics of the differential amplifier as it relates to switching high and low about the VREF point. For skewed input conditions (e.g. strong logic ones, and weak logic zeroes). The data-in path does not track the strobe (DQS) input path very well since the strobe is based on a differential input scheme and is not subject to the same variations as is the single ended data-in path.

Referring now to FIG. 3, a timing diagram for a non-skewed "normal" prior art differential data capture method is shown. External data crosses VREF prior to DQS/DQSb crossing VREF (at the same time). This is referred to as the data set-up time (TDS). The internal delay of DATA_CHIP to DQS-CHIP should maintain this relationship right to the point where the DQS and DQSB strobes latch the data. This should be true for both data rising and falling and for both rising and falling edges of the DQS strobes (four cases total).

Referring now to FIG. 4, a timing diagram for a skewed prior art differential data capture method is shown. If the logic zeroes are uniformly "weak" for both strobes and data, the data is delayed by the full amount, but the DQS/DQSB crossover still determines the internal DQS trip point and these will be less than a "full" delay. Thus TDS and/or TDH (data hold time) problems will result.

What is desired, therefore, is a data capture system for an integrated circuit that will maintain uniform delays throughout the capture process so that the maximum window for capturing the data can be maintained and performance can be improved even in skewed conditions.

SUMMARY OF THE INVENTION

According to the present invention, a circuit and corresponding method improves data capture because the internal and external strobes track the input data more precisely, even when conditions arise that cause the differences in skew from interpreting data state one and zero. This is true whether or not these skews arise from reference voltage variation, data pattern loading, power supply droop, process variations within the chip itself, or anything else.

According to the present invention, the differential input strobes are input into individual input buffers, each compared against a reference voltage (VREF) individually, just as a data input pin would be. Furthermore, the outputs from these buffers are maintained separate from each other all the way to the point where the input data is latched. In latching the input data, data ones are latched entirely based on input signals derived from a rising edge (both strobes and data), and zeros are latched entirely based on input signals derived from a falling edge (both strobes and data). In this way, any skew from the sampling of data ones and data zeros is maintained equally in the strobe and data path and therefore cancels out widening the data capture window. For the purposes of shifting the data through registers and de-serializing the data after the strobe-data latch point, the circuit and method of the present invention makes each stage of the register chain a "break before make" circuit since the strobes that are input to the register could have too much skew to use for a simple shift scheme. Furthermore, the circuit of the present invention operates in a way that the external data and strobes are transmitted simultaneously rather than having the data precede the strobe by an intended data set-up time (TDS). By transmitting simultaneously it can be better guaranteed that the exact same skew factors are seen by both the data and the strobes and thereby more easily cancelled out. Any necessary set-up or hold times can be provided on the chip with programmable delays, which of course could be programmed from outside the chip in order to optimize the overall system performance.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 6A and 6B form a schematic diagram of the data capture circuit according to the present invention;

DETAILED DESCRIPTION

In the present invention, DQS and DQSB are not put into a single differential amplifier as differential signals. Rather, each is put into a separate differential amplifier and is compared individually against a VREF reference voltage, using the same VREF reference voltage applied to individual data pin comparators.

The outputs of the DQS/DQSB differential amplifiers are run individually (separate) all the way to the latch point of the data. Even at that point, rising edge signals from a strobe are only used to trap data that originated from a rising edge, and falling edge strobes are only used to trap data that originated from a falling edge.

Therefore any skew or delay in a rising edge signal will be delayed internally equally for both the strobe and the data thereby preserving the maximum TDS/TDH window.

Special care also needs to be taken in the shift registers (de-serializer) after the data is latched. Data is typically shifted through based on clocks from the DQS signal and, of course, the DQSB complement. In the prior art case this is acceptable since the DQS and DQSB signals originate from the same differential amplifier. The DQS and DQSB signals maintain a perfect "out-of-phase" relationship, which is essential for clocking shift registers. However, in the present invention, by design, DQS and DQSB can have significant associated skew and may not be perfectly out of phase. Thus these two signals cannot be used for clocking the shift registers. A total of four clock signals need to be created so each point in the shift chain can always maintain a "break before make" relationship. These four clocks are created from the two input strobe signals DQS and DQSB.

Figure 1:
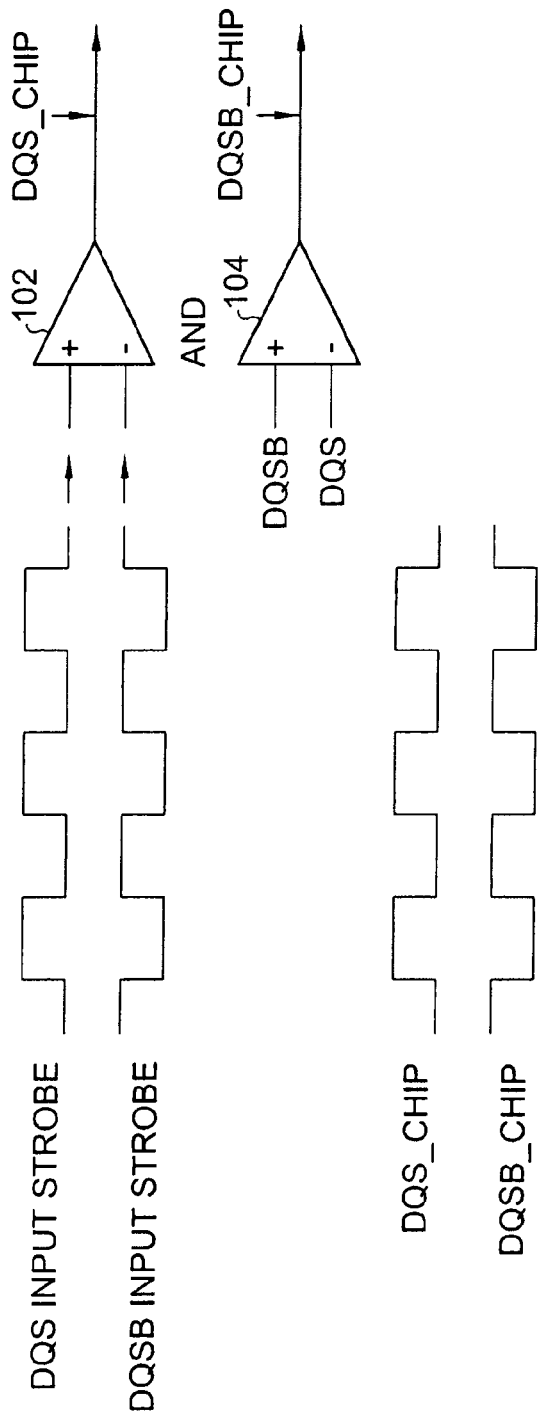
FIG. 1 is a timing diagram and circuit schematic associated with a prior art data capture circuit.
Figure 2:
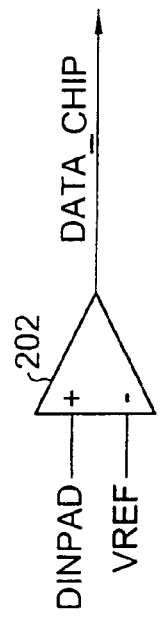
FIG. 2 is a schematic diagram of a prior art single-ended data input comparator.
Figure 3:
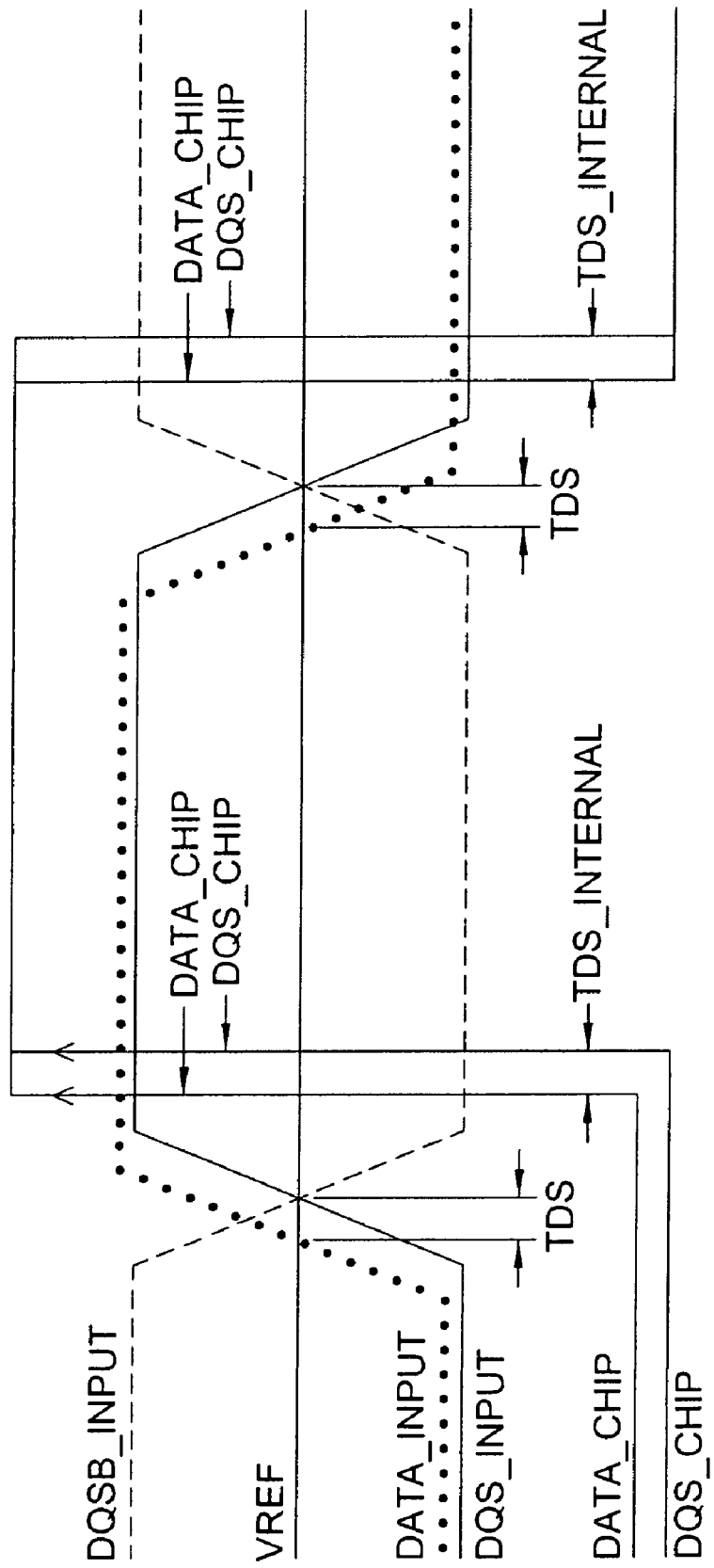
FIG. 3 is a timing diagram showing the normal method of differential data capture according to the prior art.
Figure 4:
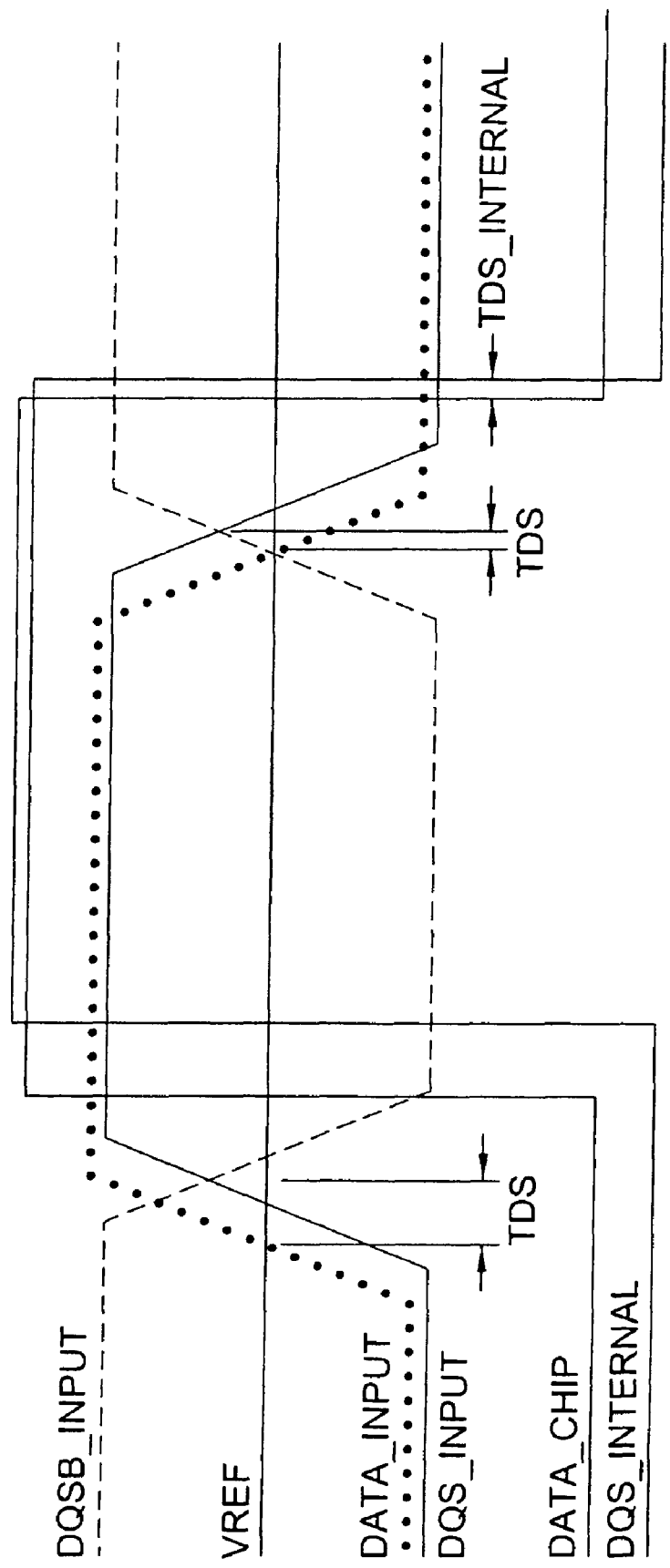
FIG. 4 is a timing diagram showing the problem for the normal method of differential data capture under skewed data conditions according to the prior art.
Figure 5:
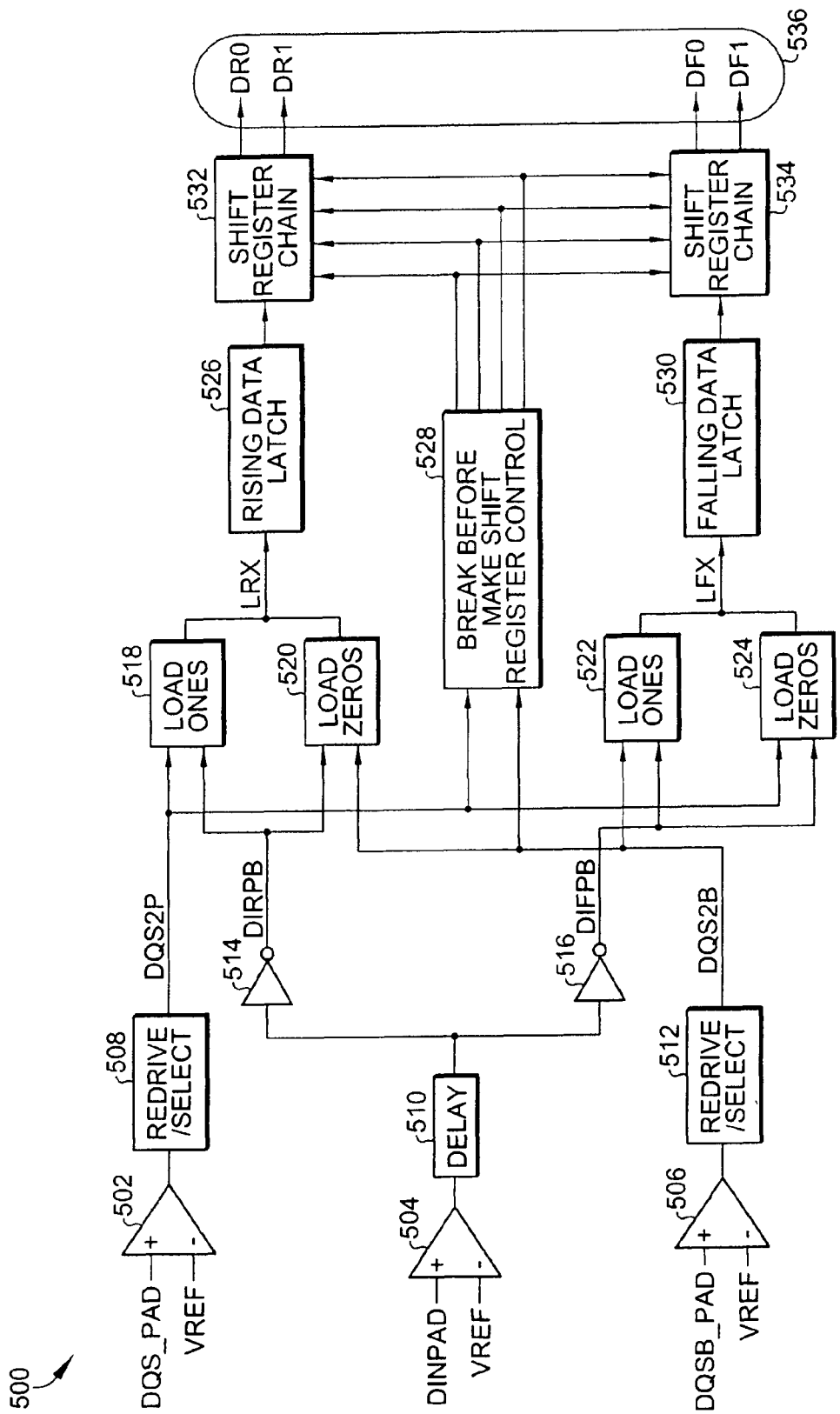
FIG. 5 is a block diagram of an embodiment of the data capture circuit of the present invention.

Referring now to FIG. 5, a block diagram of an embodiment of the data capture circuit 500 of the present invention is shown. As described above, there are three "single-ended" comparators 502, 504, and 506 included in circuit 500. Each of these comparators receive the same VREF reference voltage at the negative input thereof. The positive input of comparator 502 receives the DQS_PAD strobe signal. The positive input of comparator 506 receives the DQSB_PAD strobe signal. The positive input of comparator 504 receives the DINPAD data signal. The output of comparator 502 is coupled to REDRIVE/SELECT circuit 508 and the output of comparator 506 is coupled to REDRIVE/SELECT circuit 512. The output of comparator 504 is coupled to DELAY circuit 510, the output of which is coupled to inverters 514 and 516. The output of REDRIVE circuit 508 provides the DQS2P signal and the output of REDRIVE circuit 512 provides the DQS2B signal. The output of inverter 514 provides the DIRPB signal and the output of inverter 516 provides the DIFPB signal. The LOAD ONES circuit 518 receives the DQS2P and DIRPB signals. The LOAD ZEROS circuit 520 receives the DIRPB and DQS2B signals. The LOAD ONES circuit 522 receives the DQS2B and DIFPB signals. The LOAD ZEROS circuit 524 receives the DQS2P and DIFPB signals. The BREAK BEFORE MAKE SHIFT REGISTER CONTROL circuit 528 receives the DQS2P and DQS2B signals. The RISING DATA LATCH BIT circuit 526 receives the LRX signal from LOAD ONES circuit 518 and LOAD ZEROS circuit 520. The FALLING DATA LATCH BIT circuit receives the LFX signal from LOAD ONES circuit 522 and LOAD ZEROS circuit 524. The BREAK BEFORE MAKE SHIFT REGISTER CONTROL circuit 528 provides four control signals that are received by SHIFT REGISTER CHAIN 532 and SHIFT REGISTER CHAIN 534. The output of RISING DATA LATCH BIT 526 is also coupled to SHIFT REGISTER CHAIN 532. The output of FALLING DATA LATCH BIT 530 is also coupled to SHIFT REGISTER CHAIN 534. Finally, data output signals DR0 and DR1 are provided by SHIFT REGISTER CHAIN 532 and data output signals DF0 and DF1 are provided by SHIFT REGISTER CHAIN 534. Further detail of the block diagram representation of the data capture circuit 500 of the present invention is provided below with reference to schematic level figures and corresponding timing diagrams.

Figure 6B:
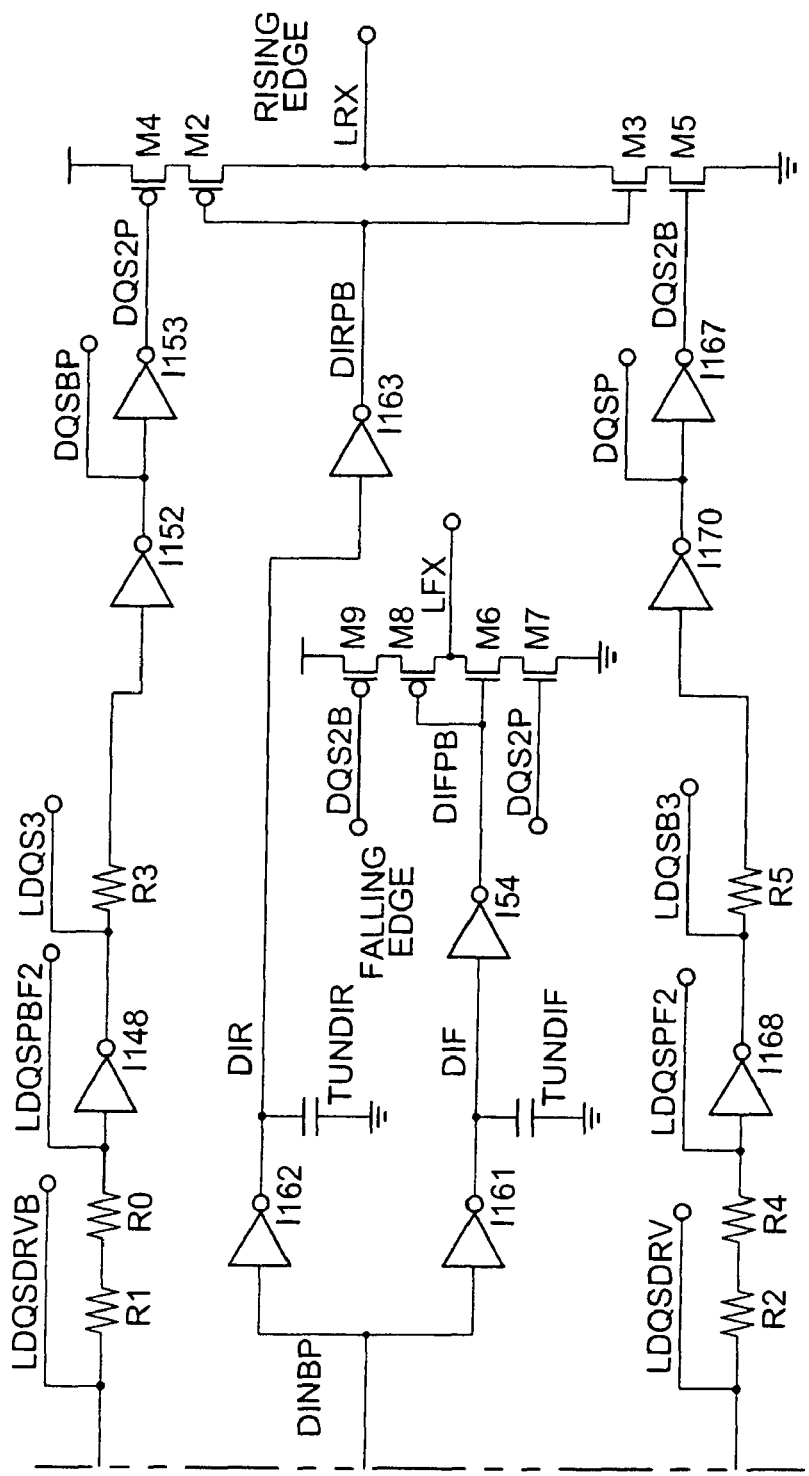

A portion of the overall circuit of the present invention is shown in FIGS. 6A and 6B. Note that paths A and B (DQS_PAD and DQSB_PAD) each have their own differential amplifier input buffer 502, 506 using the same VREF reference voltage. Complementary differential inputs are not used. Paths A and B are similar to path C, which is the path of the differential data input buffer 504. The same VREF reference voltage is used to compare the DINPAD data input signal.

Strobe path A includes differential amplifier 502 for receiving the DQS_PAD strobe signal and the VREF reference voltage for providing a signal to inverter I139. The output of inverter I139 is coupled to the input of inverter I145. Inverter I145 is coupled to inverter I147 and provides the DQSMOSB signal. Inverter I147 receives the DQSMOSB signal and is coupled to passgate I533. Passgate I532 (described below) is always off and passgate I533 is always on and are used to provide proper signal path matching with switched passgates I3 and I11, described in further detail below. As part of the signal path matching circuitry, passgate I532 receives the DQSMOS signal through inverters I12 and I15. Passgates I532 and I533 provide the TUNDQS signal and are coupled to capacitor TUNA and inverter I149. Inverter I149 provides the LDQSDRVB signal and is coupled to resistors R1 and R0, which represent significant signal resistance on the chip. Resistor R0 provides the LDQSPBF2 signal and is coupled to inverter I148. Inverter I148 provides the LDQS3 signal and is coupled to resistor R3, which also represents significant signal resistance on the chip. Resistor R3 is coupled to inverter I152. Inverter I152 provides the DQSBP signal and is coupled to inverter I153. Inverter I153 provides the DQS2P signal and is coupled to the gate of P-channel transistor M4.

Data path B includes differential amplifier 504 for receiving the DINPAD data signal and the VREF reference voltage for providing a signal to inverter I155. Inverter I155 is coupled to serially coupled inverters I155, I156, I157, and I158. Inverter I158 provides the DINB signal and is coupled to inverter I159. The output of inverter I159 provides the TUNDIN signal and is coupled to capacitor TUNC and to inverter I160. Inverter I160 provides the DINBP signal and is coupled to inverters I162 and I161. Inverter I162 provides the DIR signal and is coupled to capacitor TUNDIR and to inverter I163. Inverter I163 provides the DIRPB signal and is coupled to the gate of P-channel transistor M2 and to the gate of N-channel M3. The coupled drains of transistors M2 and M3 provide the rising edge data signal LRX. Inverter I161 provides the DIF signal and is coupled to capacitor TUNDIF and to inverter I54. Inverter I54 provides the DIFPB signal and is coupled to the gate of P-channel transistor M8 and to the gate of N-channel transistor M6. The gate of P-channel transistor M9 receives the DQS2B signal. The gate of N-channel transistor M7 receives the DQS2P signal. The coupled drains of transistors M6 and M8 provide the falling edge data signal LFX.

Strobe path C includes differential amplifier 506 for receiving the DQSB_PAD strobe signal and the VREF reference voltage for providing a signal to inverter I165. Inverter I165 is coupled to inverter I164 and provides the DQSMOS signal. Inverter I166 receives the DQSMOS signal and is coupled to passgate I11, which is controlled by the SELBX and SELVREF signals. A parallel passgate I3 has an input for receiving the DQSMOSB signal through inverter I10. Passgate I3 is also controlled by the SELBX and SELVREF signals. Passgates I3 and I11 provide the TUNDQSB signal and are coupled to capacitor TUNB and inverter I169. Inverter I169 provides the LDQSDRV signal and is coupled to resistors R2 and R4. Resistor R4 provides the LDQSPF2 signal and is coupled to inverter I168. Inverter I168 provides the LDQSB3 signal and is coupled to resistor R5. Resistor R5 is coupled to inverter I170. Inverter I170 provides the DQSP signal and is coupled to inverter I167. Inverter I167 provides the DQS2B signal and is coupled to the gate of N-channel transistor M5.

With respect to FIGS. 6A and 6B, capacitors TUNA, TUNB, TUNC, TUNDIR, and TUNDIF are all "tunable" capacitors. As will be realized by those skilled in the art, all of the signal paths are ideally matched in terms of delay. To that end, the tunable capacitors are all selectively tunable to a specific capacitor value. Those skilled in the art will readily appreciate that there are many ways for providing a tunable capacitor in integrated circuits including using metal mask options, fuse circuitry or other programmable circuitry. With respect to FIG. 6A, signals SELBX and SELVREF are used to switch between a differential input strobe system and a non-differential strobe (single ended) system. An embodiment of the invention is primarily directed at the case of a system using differential strobes, but a non-differential strobe case is also supported. This alternative embodiment of the invention is provided mostly for reasons related to testing, but some systems may choose to not run a non-differential strobe if higher performance is not a primary goal. In the non-differential strobe case only the DQS_PAD is used and the DQSB_PAD is left unused. By way of known techniques such as mode registers, the SELVREF signal will be high and the SELBX signal will be low in the non-differential strobe case. Therefore the I11 transfer gate will be off, the I3 transfer gate will be on, and only the DQS_PAD and its associated path will be utilized. In the differential strobe input case of both the DQS_PAD and DQSB_PAD being utilized, SELFREF will be low (and SELBX will be high) such that the transfer gate I11 is on and the I3 gate is off and both the DQS_PAD and DQSB_PAD paths will be utilized. Note that I533 is always on and I532 is always off regardless of which mode is chosen.

The circuitry shown in FIG. 6A roughly corresponds to items 502, 504, 506, 508, 510, and 512 shown in FIG. 5. In operation, the circuitry of FIG. 6A essentially provides the following functions: selects one or both of the DQS, boosts the drive capability through all of the inverters and other intervening circuitry, and provide delay tuning capability. The circuitry shown in FIG. 6B roughly corresponds to items 514, 516, 518, 520, 522, 524, and 528 shown in FIG. 5. In operation, the circuitry of FIG. 6B is to separately load the rising and falling data (that is, data captured on the rising and falling edge of the strobe signal). Specifically, transistors M2 and M4 load data ones on the rising edge of the strobe signal. Transistors M3 and M5 load data zeros on the rising edge of the strobe signal. Transistors M8 and M9 load data ones on the falling edge of the strobe signal. Finally, transistors M6 and M7 load data zeros on the falling edge of the strobe signal. The circuitry in FIGS. 7A and 7B corresponds to blocks 526, 530, 532, 534, and 536 shown in the block diagram of FIG. 5, which is the main data latching and shifting circuit according to the present invention.

Figure 7A:
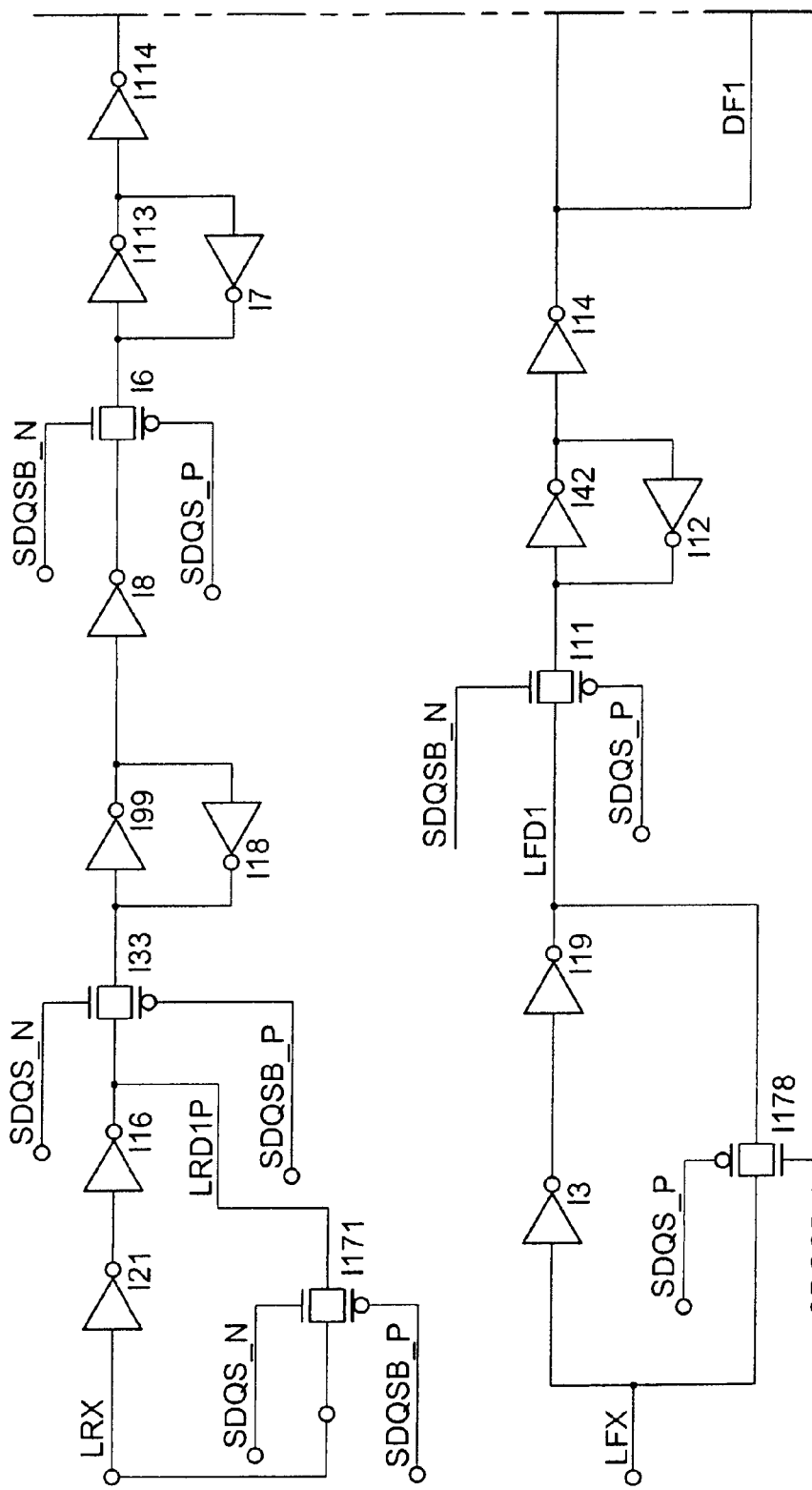
FIGS. 7A and 7B form a schematic diagram of the main data latching and shifting circuit according to the present invention.
Figure 7B:
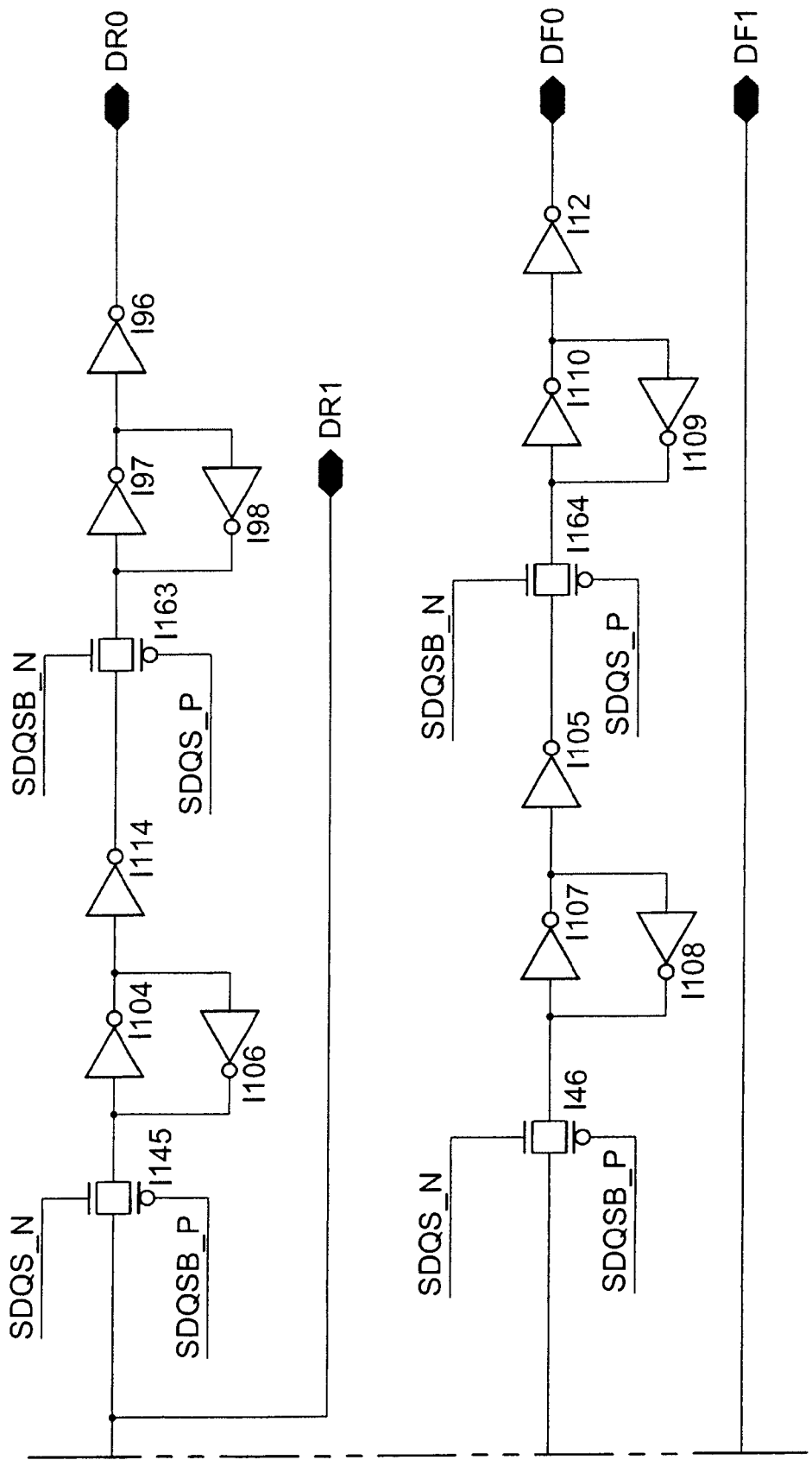

Referring now to FIG. 7A and FIG. 7B, serially coupled inverters I21 and I16 receive the LRX signal. Passgate I171 also receives the LRX signal, as well as the SDQS_N and SDQSB_P control signals. The signal at the output of passgate I171 is labeled LRD1P. Passgate I33 receives the LRD1P signal, as well as the SDQS_N and SDQSB_P control signals. The output of passgate I33 is coupled to one end of a latch including inverters I18 and I99. The other end of the latch is coupled to inverter I8. The output of inverter I8 is coupled to passgate I6, which also receives the SDQSB_N and SDQS_P control signals. The output of passgate I6 is coupled to one end of a latch including inverters I113 and I7. The other end of the latch is coupled to inverter I114. The output of inverter I114 is coupled to the input of passgate I145, which also receives the SDQS_N and SDQSB_P control signals. The output of inverter I114 also provides the DR1 data signal. The output of passgate I145 is coupled to one end of a latch including inverters I104 and I106. The other end of the latch is coupled to the input of inverter I114. The output of inverter I114 is coupled to passgate I163, which also receives the SDQSB_N and SDQS_P control signals. The output of passgate I163 is coupled to one end of a latch including inverters I97 and I98. The other end of the latch is coupled to the input of inverter I96. The output of inverter I96 provides the DR0 data signal.

Still referring to FIG. 7A and FIG. 7B, serially coupled inverters I3 and I19 receive the LFX signal. Passgate I178 also receives the LFX signal, as well as the SDQSB_N and SDQS_P control signals. The signal at the output of passgate I178 is labeled LFD1. Passgate I11 receives the LFD1 signal, as well as the SDQSB_N and SDQS_P control signals. The output of passgate I11 is coupled one end of a latch including inverters I42 and I12. The other end of the latch is coupled to inverter I14. The output of inverter I14 is coupled to passgate I46, which also receives the SDQS_N and SDQBS_P control signals. The output of inverter I14 also provides the DF1 data signal. The output of passgate I146 is coupled to one end of a latch including inverters I107 and I108. The other end of the latch is coupled to the input of inverter I105. The output of inverter I105 is coupled to passgate I164, which also receives the SDQSB_N and SDQS_P control signals. The output of passgate I164 is coupled to one end of a latch including inverters I110 and I109. The other end of the latch is coupled to the input of inverter I12. The output of inverter I12 provides the DF0 data signal.

In operation, the LRX node indicates the rising DQS latch point. The LFX node is the latch point for data on the falling edge of DQS. For the rising DQS edge case (LRX), and the data is also rising, then "DIRPB"=logic zero. This is the node and state of interest and is latched directly via P-channel transistors M2 and M4 (shown in FIG. 6B). Transistor M4 is gated by signal DQS2P, which is derived from DQS comparator 502. Signal DQS2P is also a "rising" edge in this case. Therefore, the delay in signal DQS2P should match the delay in signal DIRPB, at least as far as "rising" edges are treated in the differential amplifiers 502 and 504. If the data state is zero, then N-channel transistors M3 and M5 are critical, but M5 is derived from DQSB, which is a "falling" edge.

Figure 8:
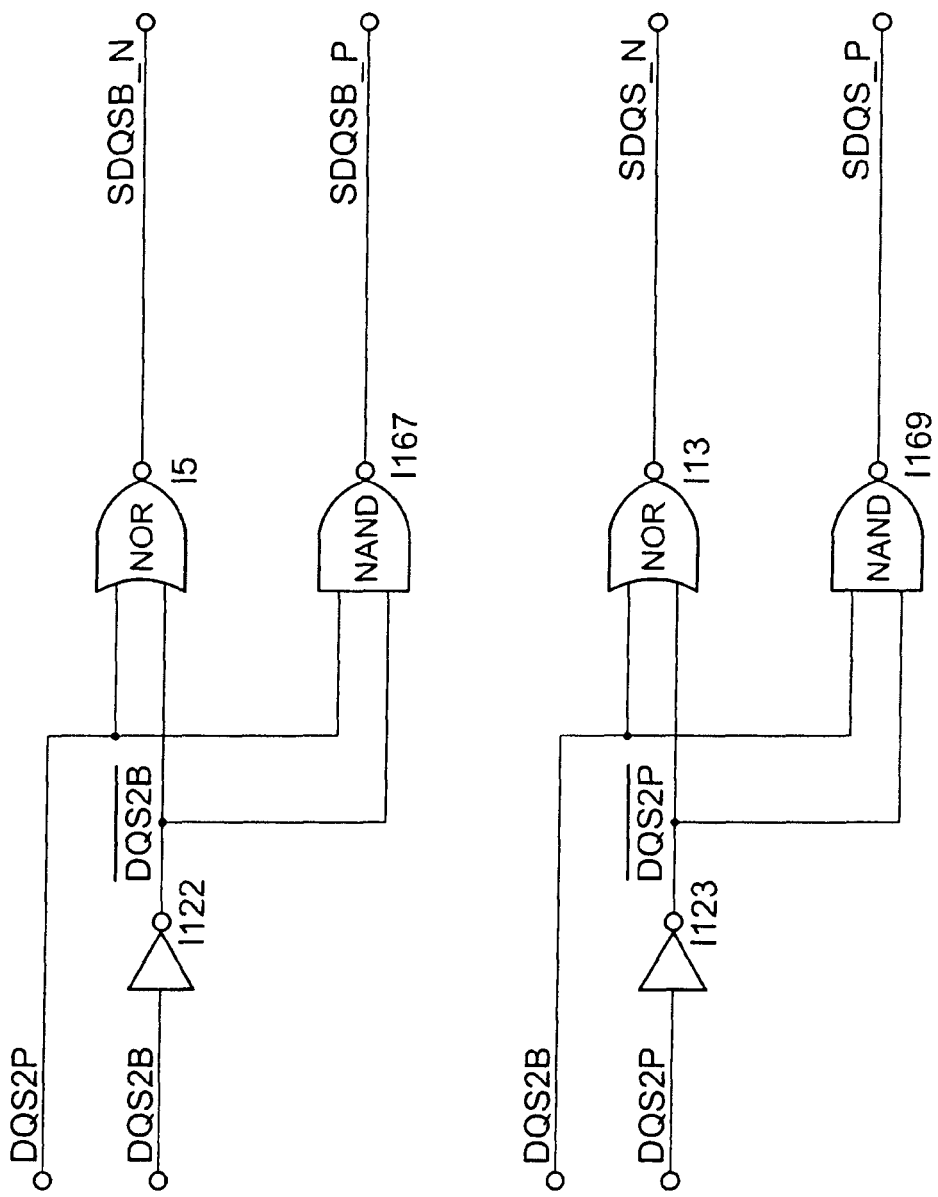
FIG. 8 is a schematic diagram of a circuit for providing signals to the data latching and shifting circuit shown in FIGS. 7A and 7B.

The circuitry in FIG. 8 corresponds to block 528 shown in FIG. 5. The circuit shown in FIG. 5 includes inverters I122 and I123, NOR gates I5 and I13, as well as NAND gates I167 and I169. NOR gate I5 receives the DQS2P signal and the inverted DQS2B signal to provide the SDQSB_N signal. NAND gate I167 receives the DQS2P signal and the inverted DQS2B signal to provide the SDQSB_P signal. NOR gate I13 receives the DQS2B signal and the inverted DQS2P signal to provide the SDQS_N signal. NAND gate 1169 receives the DQS2B signal and the inverted DQS2P signal to provide the SDQS_P signal. In operation, the circuit of FIG. 8 provides the control signals to the passgates in FIGS. 7A and 7B to provide "break before make" functionality, which is described in further detail below.

Transfer gates that are "open" while DQS is high are controlled by SDQS_N to the N-channel device and SDQSB_P to the P-channel device. Transfer gates "open" while DQS=low (closed for high case) have the N-channel controlled by SDQSB_N and the P-channel by SDQS_P. These signals are generated from the logic block circuit shown in FIG. 7, since "break before make" functionality is desired to prevent data run-through. SDQSN will go low (off for N-channel transistors) if either DQS2B or DQS2P goes high. ($\overline{DQS2P}$=DQS2P inverted via I123). Likewise SDQSB_P will go high (off for P-channel transistors) if either DQS2P goes low or DQS2B goes low ($\overline{DQS2B}$=DQS2B inverted via I122). Thus "break before make" is maintained throughout the shift chain, regardless of input data skew, and no data run-through will occur.

Figure 9:
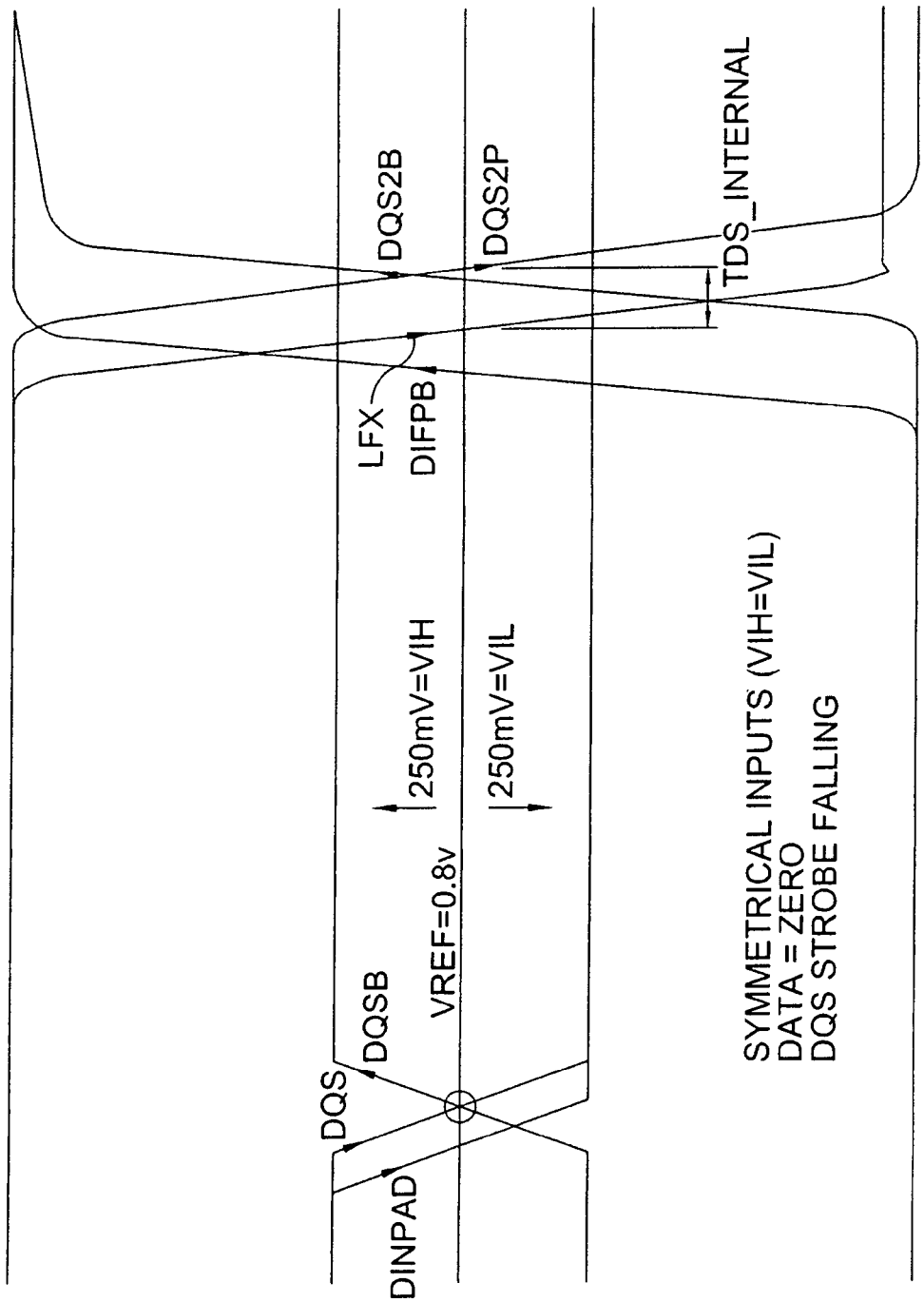
FIGS. 9-17 are timing diagrams associated with the data capture circuit of the present invention showing enhanced circuit performance during both normal and skewed data operating conditions.

The timing simulation of FIG. 9 shows an example of trapping data in the falling edge case. This is the "normal" case and the logic ones and zeros for the strobe inputs and the input data have symmetrical delays through the signal paths (the prior art circuit would work in this case as well). In FIG. 9, strobe signal DQS falls and strobe signal DQSB rises, crossing at the VREF point. The DINPAD data signal falls (=TDS) prior to the strobes in this example. The DIFPB signal first rises (inverted from the original DINPAD signal). The DQS2P signal is still high, so both transistors M6 and M7 (N-channel transistors from FIG. 6B) are on and the LFX signal falls. Then the DQS2P signal falls, which latches the LFX equals zero state. The DQSB signal rises, but since DIFPB is already at a logic one, the M9, M8 P-channel path (seen in FIG. 6B) are already off.

Figure 10:
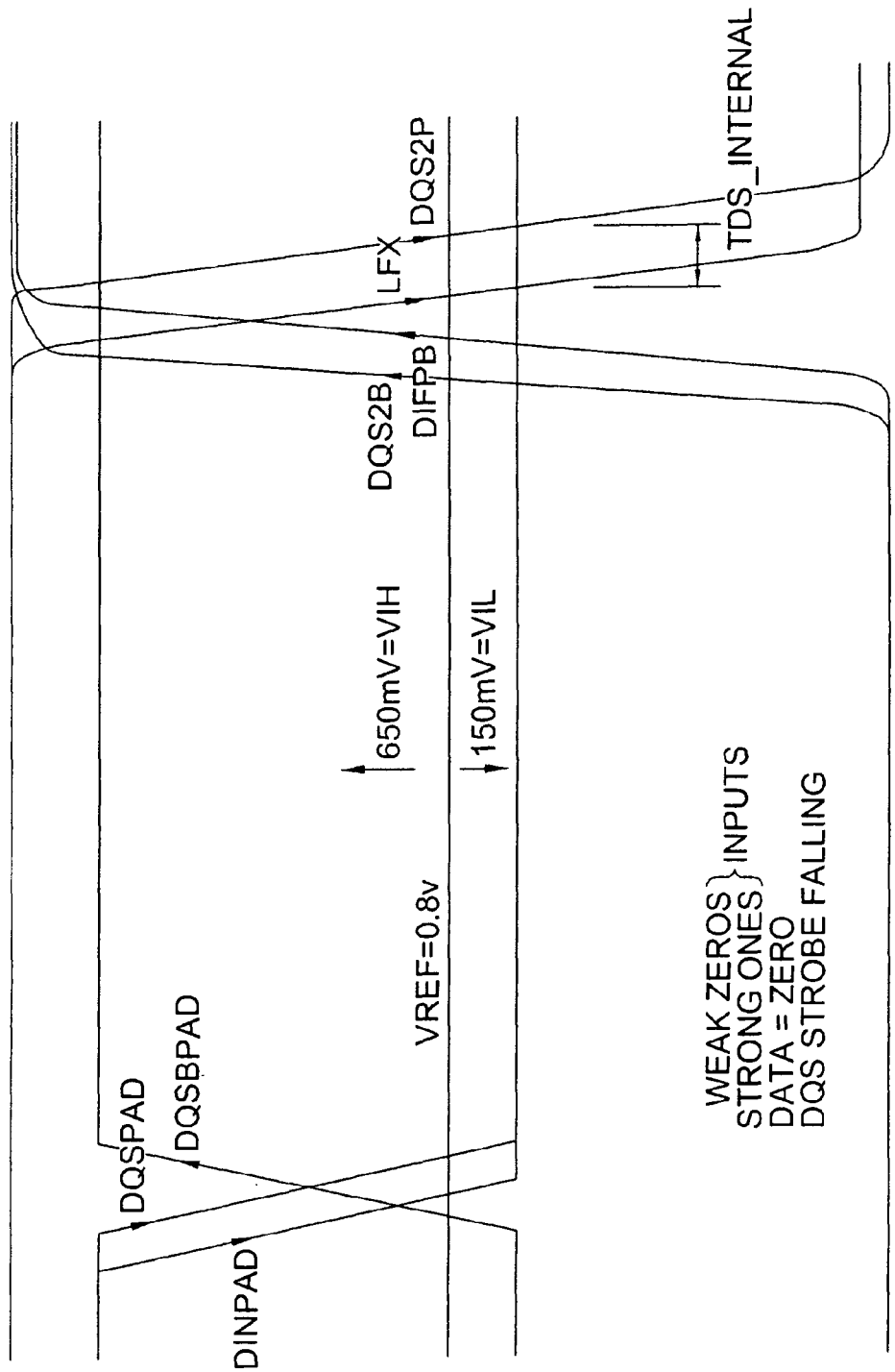

For the simulation in FIG. 10 VIH is raised by 650 mV and VIL is lowered by 150 mV from the base reference voltage of 800 mV. This simulation illustrates the case of weak zeros to further illustrate the method of operation of the present invention. In the simulation, as well in all subsequent simulation, skewed conditions are simulated by moving the VIH and VIL thresholds with a voltage offset. While this is a valid way of simulating a data skewed condition, skews can arise from reference voltage variation, data pattern loading, power supply droop, process variations within the chip itself, or anything else. The circuit of the present invention is designed to address all of these skew conditions, even though each and every source of the skew condition is not simulated.

Since all falling edges are delayed (weak zeros), the DQS2B signal actually rises before the data (DIFPB rising) gets there. This is because DQS2B originates from a rising edge and is not delayed. However, both DIFPB rising and DQS2P falling are delayed (both originate from rising pad signals), so LFX falls and a zero is still latched as in the previous timing example. If DQS2B and DQS2P still crossed each other based on a point where the DQS and DQSB pads crossed, the LFX=0 state probably would not have been obtained. The simulation of FIG. 10 shows the relationship of the four shift clocks as a result of the skewed inputs of the weak zero simulation.

Figure 11:
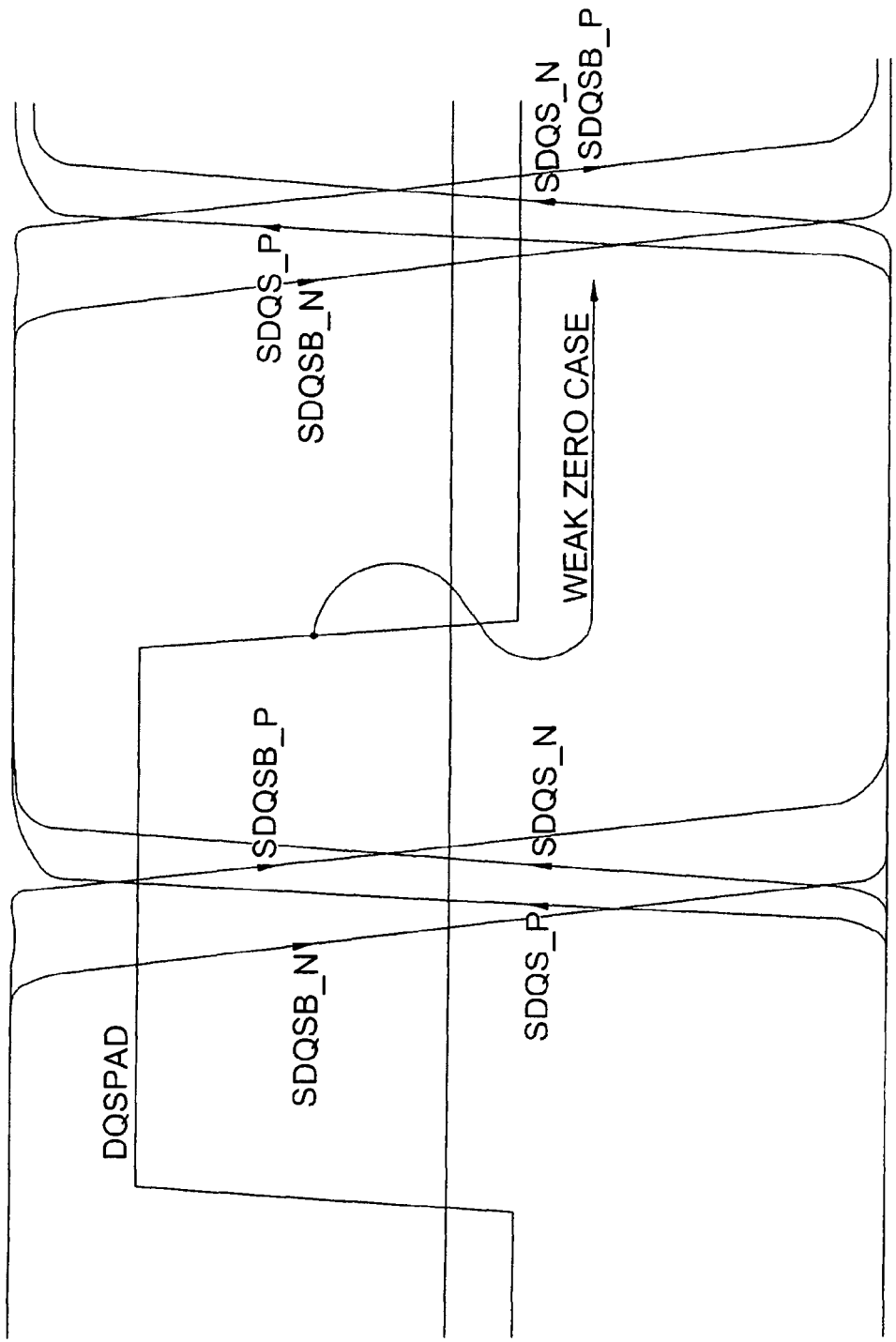

A still further simulation result having weak data zeros is shown in FIG. 11. DQS falling is delayed (DQS2P) and DQSB rising is faster (DQS2B). SDQS_N goes low right away and SDQSB_P goes high right away (both in response to DQS2B being fast) to close off the transfer gates that need to be closed when DQS=0. SDQSB_N and SDQS_P transition later when their respective NOR and NAND equations are resolved so the pass gates needing to be "open" when DQS=0 is in such a state.

Figure 12:
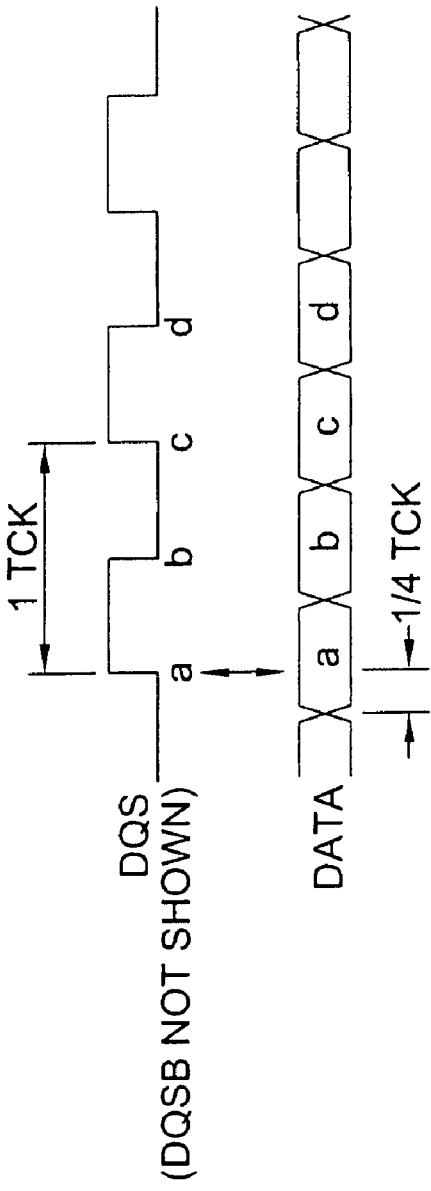

Referring now to FIG. 12, for optimal system performance, the data-in and the strobes should be provided to the chip at the same time. Previous system timings tried to provide, in the case of the DDR memories, the data ¼ tck before the strobes.

Figure 13:
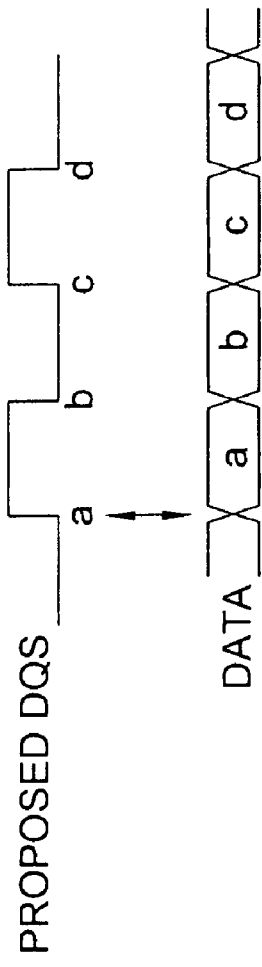
Figure 14:
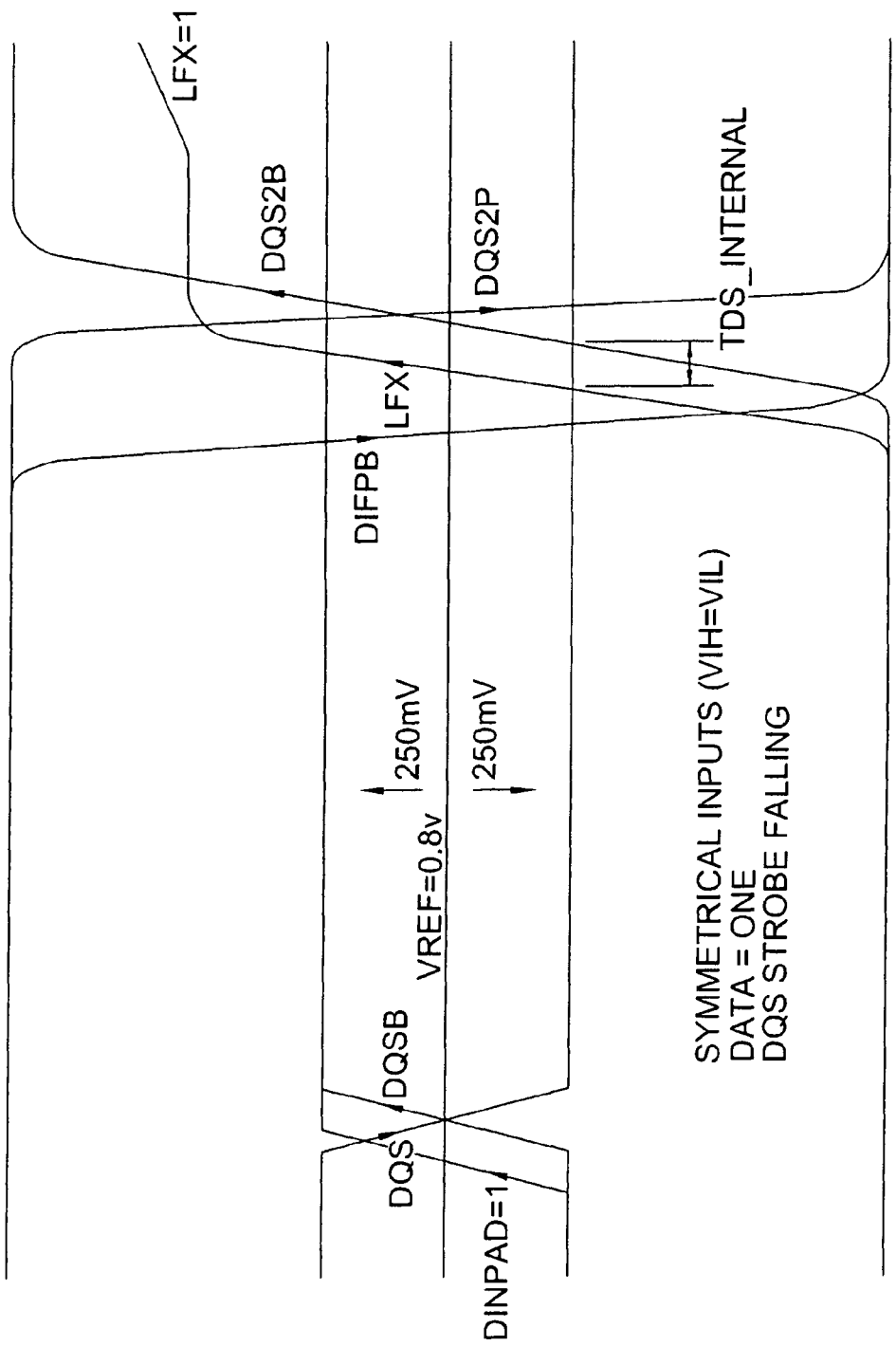
Figure 15:
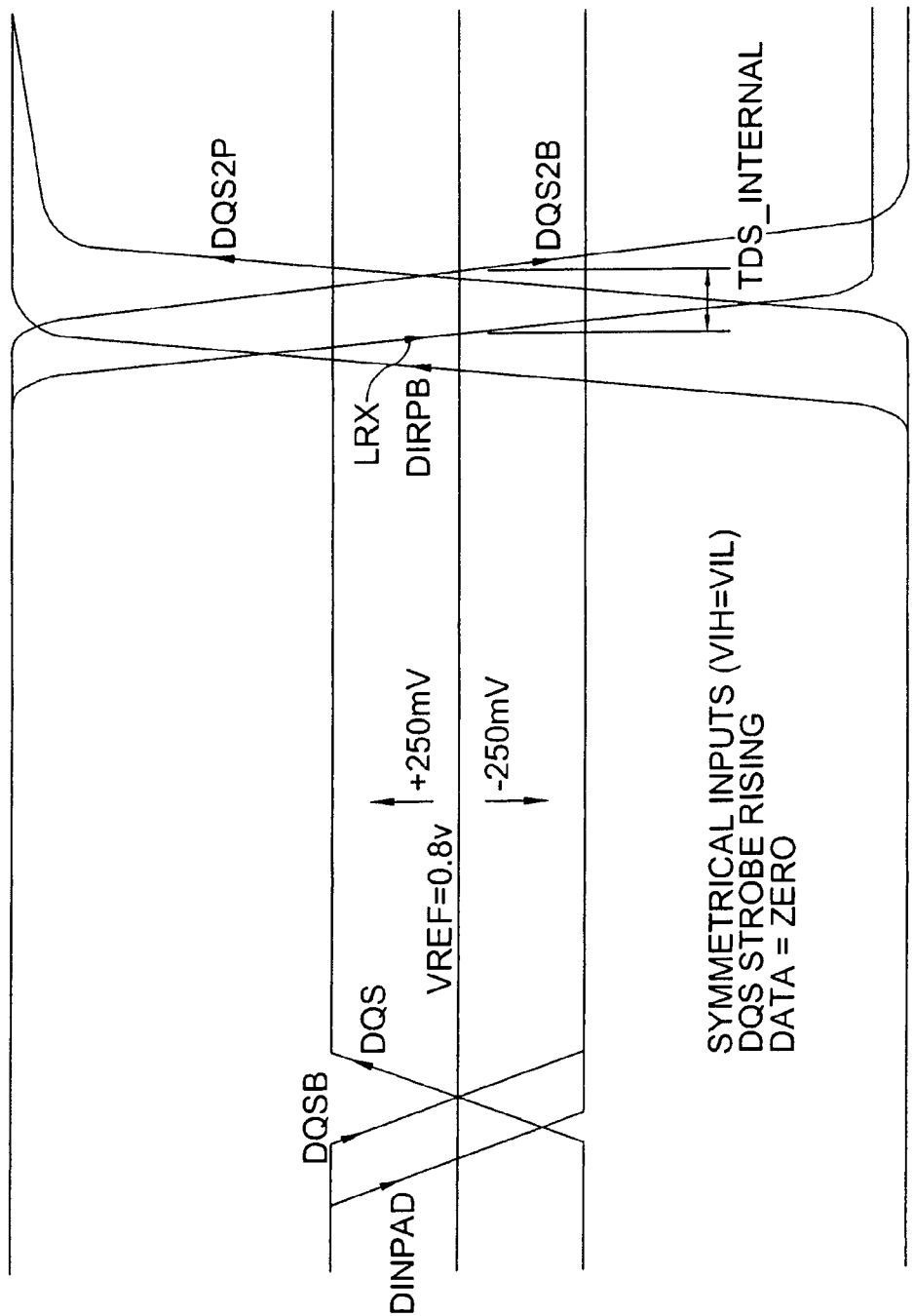
Figure 16:
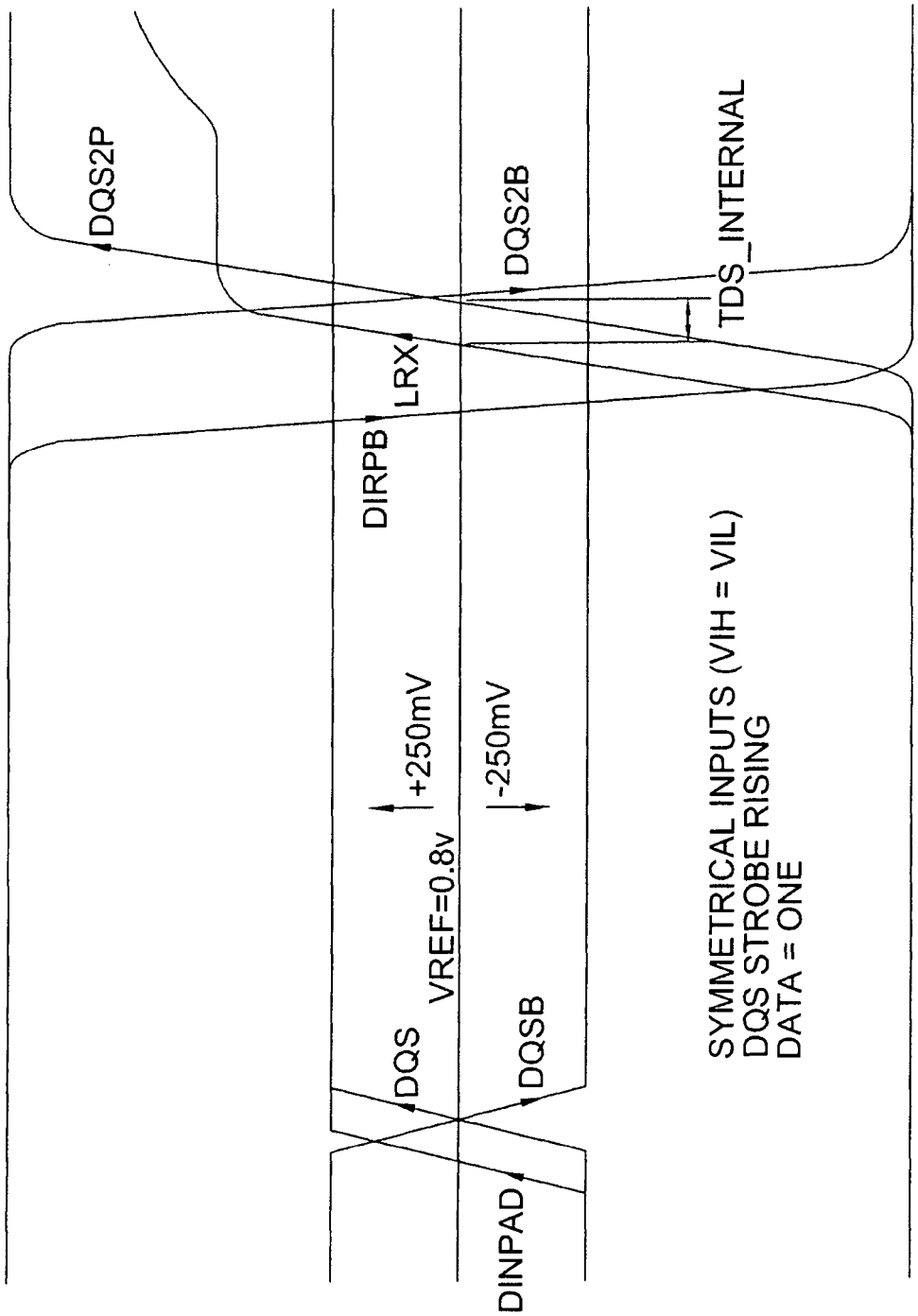
Figure 17:
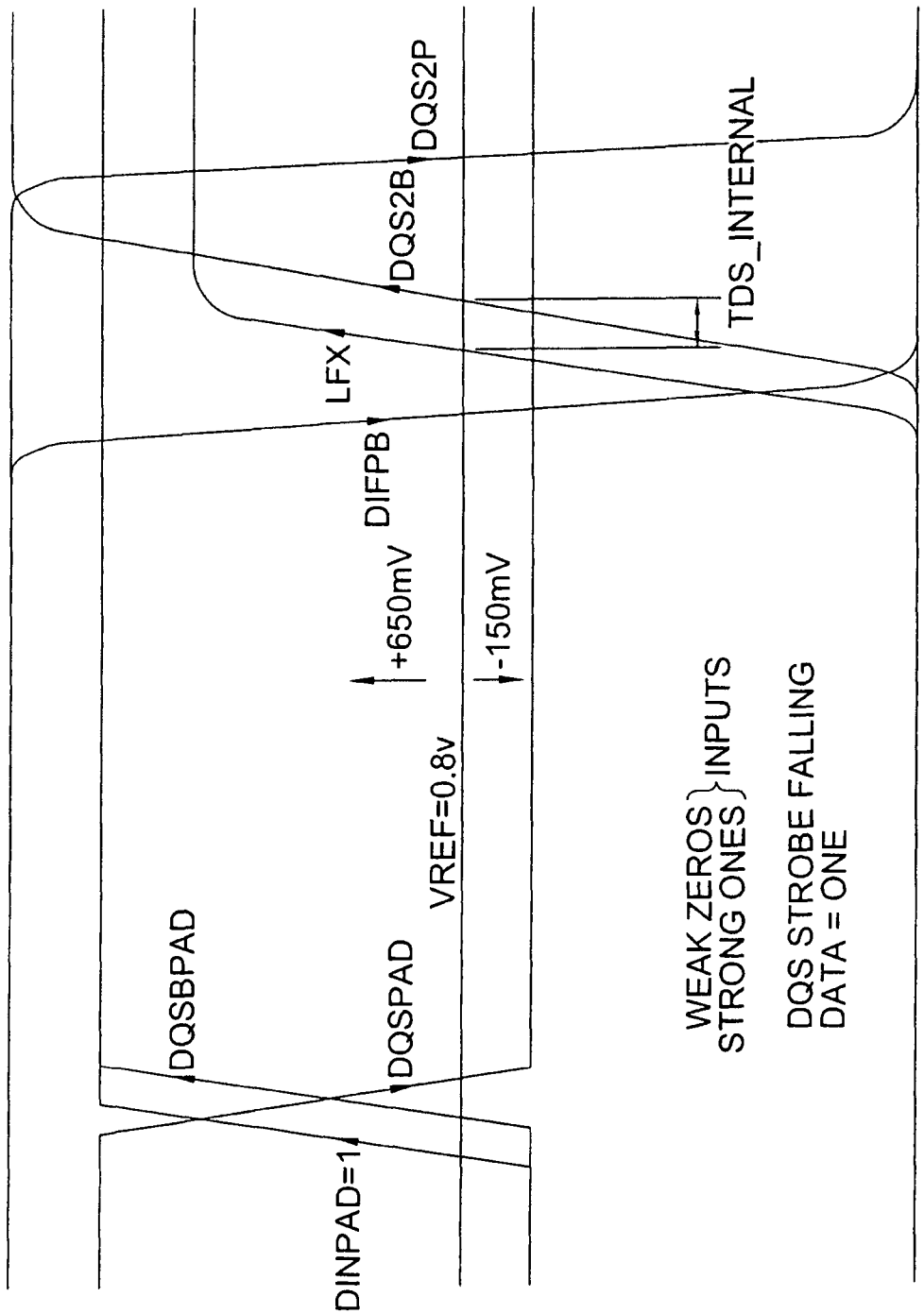

Referring now to FIG. 13, however, the skew, whether the result of VREF drifting or data pattern loading (e.g. one zero in a field of ones) could vary in that ¼ tck time frame. If the strobes and data were presented at exactly the same time, then this new scheme effectively cancels out all the skew factors. Due to flight time and routing delays within the chip, DQS effectively gets delayed before reaching the latch point of the data anyway, thereby "building in" data set-up time. For "training" purposes the chip (memory in our case) could receive register settings to increase or decrease this internal delay and optimize the system performance.

Further simulation results are provided in FIGS. 14-17. The simulation result of FIG. 14 (the sister case to FIG. 9) has symmetrical inputs, data is equal to one, with a DQS strobe falling. The simulation result of FIG. 15 has symmetrical inputs, data is equal to zero, with a DQS strobe rising. The simulation result of FIG. 16 has symmetrical inputs, data is equal to one, with a DQS strobe rising. The simulation result of FIG. 17 (the sister case to FIG. 10) has weak zeros, strong ones, data is equal to one, and a DQS strobe falling. The point of all of these simulations is that the TDS_INTERNAL time period is the same as the initial time period between the data and the strobe. In other words, this time period is maintained the entire way through the signal path of the data capture circuit of the present invention.

Having described and illustrated the principle of the invention in a preferred embodiment thereof, it is appreciated by those having skill in the art that the invention can be modified in arrangement and detail without departing from such principles. Although a preferred method and circuit have been shown, the exact details of the preferred method and circuit can be changed as desired as required for a particular application. We therefore claim all modifications and variations coming within the spirit and scope of the following claims.

I claim:

1. A data capture circuit comprising:
   a differential strobe signal including first and second single-ended strobe signals;
   a single-ended data signal;
   a reference voltage;
   a first differential amplifier having a first input for receiving the first single-ended strobe signal, a second input for receiving the reference voltage, and an output;
   a second differential amplifier having a first input for receiving the single-ended data signal, a second input for receiving the reference voltage, and an output;
   a third differential amplifier having a first input for receiving the second single-ended strobe signal, a second input for receiving the reference voltage, and an output;
   a first dual-cascode circuit having first and second P-channel transistors and first and second N-channel transistors with their respective current paths in cascode connection, a gate of the first P-channel transistor being coupled to the output of the first differential amplifier, a gate of the second P-channel transistor and the first N-channel transistor being coupled together and to the output of the second differential amplifier, and a gate of the second N-channel transistor being coupled to the output of the third differential amplifier, and an output for providing a rising data signal; and a second dual-cascode circuit having first and second P-channel transistors and first and second N-channel transistors with their respective current paths in cascade connection, a gate of the first P-channel transistor being coupled to the output of the first differential amplifier, a gate of the second P-channel transistor and the first N-channel transistor being coupled together and to the output of the second differential amplifier, and a gate of the second N-channel transistor being coupled to the output of the third differential amplifier, and an output for providing a falling data signal, wherein the rising and falling data signals are subsequently processed to provide falling edge zero, falling edge one, rising edge zero, and rising edge one data signals.

2. The data capture circuit of claim 1 further comprising:

a rising data latch circuit having an input for receiving the rising data signal and an output; and a falling data latch circuit having an input for receiving the falling data signal and an output.

3. The data capture circuit of claim 2 further comprising:

a first shift register chain coupled to the rising data latch circuit for providing the rising edge zero and rising edge one data signals; and a second shift register chain coupled to the falling data latch circuit for providing the falling edge zero and falling edge one data signals.

4. The data capture circuit of claim 3 further comprising a break before make shift register control circuit having a first input coupled to the output of first differential amplifier, a second input coupled to the output of the third differential amplifier, and an output for providing a plurality of control signals to the first shift register chain and to the second shift register chain.

5. The data capture circuit of claim 1 further comprising selection circuitry for selecting between a non-differential strobe mode and a differential strobe mode.

6. The data capture circuit of claim 1 further comprising at least one tunable capacitor for adjusting the delay of a signal path associated with the first, second, or third differential amplifier outputs.

7. A data capture circuit comprising:

a differential strobe signal including first and second single-ended strobe signals;

a single-ended data signal;

a reference voltage;

a first differential amplifier having a first input for receiving the first single-ended strobe signal, a second input for receiving the reference voltage, and an output;

a second differential amplifier having a first input for receiving the single-ended data signal, a second input for receiving the reference voltage, and an output;

a third differential amplifier having a first input for receiving the second single-ended strobe signal, a second input for receiving the reference voltage, and an output;

a first dual-cascade circuit having first and second P-channel transistors and first and second N-channel transistors with their respective current paths in cascode connection, a gate of the first P-channel transistor being coupled to the output of the first differential amplifier, a gate of the second P-channel transistor and the first N-channel transistor being coupled together and to the output of the second differential amplifier, and a gate of the second N-channel transistor being coupled to the output of the third differential amplifier, and an output for providing a rising data signal; and a second dual-cascode circuit having first and second P-channel transistors and first and second N-channel transistors with their respective current paths in cascade connection, a gate of the first P-channel transistor being coupled to the output of the first differential amplifier, a gate of the second P-channel transistor and the first N-channel transistor being coupled together and to the output of the second differential amplifier, and a gate of the second N-channel transistor being coupled to the output of the third differential amplifier, and an output for providing a falling data signal, wherein the rising and falling data signals are subsequently processed to provide captured data signals such that an initial setup time period between at least one of the strobe signals and the data signal is maintained during subsequent processing.

8. The data capture circuit of claim 7 wherein the captured data signals comprise falling edge zero, falling edge one, rising edge zero, and rising edge one data signals.

9. The data capture circuit of claim 7 further comprising a plurality of tunable capacitors.

10. The data capture circuit of claim 7 further comprising a shift register chain having a plurality of control inputs for preventing data run-through.

* * * * *